United States Patent
Bechtel et al.

(10) Patent No.: US 7,969,089 B2
(45) Date of Patent: Jun. 28, 2011

(54) LED WITH IMPROVED LIGHT EMISSION PROFILE

(75) Inventors: Helmut Bechtel, Roetgen (DE);
Wolfgang Busselt, Roetgen (DE); Georg Friedrich Gartner, Aachen (DE); Eliav Itzhak, Eindhoven (NL); Joachim Opitz, Aachen (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 279 days.

(21) Appl. No.: 11/570,345

(22) PCT Filed: Jun. 10, 2005

(86) PCT No.: PCT/IB2005/051914
§ 371 (c)(1),
(2), (4) Date: Dec. 11, 2006

(87) PCT Pub. No.: WO2005/124887
PCT Pub. Date: Dec. 29, 2005

(65) Prior Publication Data
US 2007/0257590 A1 Nov. 8, 2007

(30) Foreign Application Priority Data
Jun. 14, 2004 (EP) .................... 04102697

(51) Int. Cl.
*H05B 33/02* (2006.01)
(52) U.S. Cl. ............... 313/506; 313/498; 315/169.3
(58) Field of Classification Search ........ 313/498–512; 315/169.1, 169.3; 428/690–691, 917; 438/26–29, 438/34, 82; 257/40, 72, 98–100, 642–643, 257/759; 427/58, 64, 66, 532–535, 539; 445/24–25
See application file for complete search history.

(56) References Cited

U.S. PATENT DOCUMENTS

| | | | | |
|---|---|---|---|---|
| 5,728,308 A | * | 3/1998 | Muroyama | 216/88 |
| 5,955,837 A | * | 9/1999 | Horikx et al. | 313/506 |
| 6,476,550 B1 | * | 11/2002 | Oda et al. | 313/504 |
| 6,965,197 B2 | * | 11/2005 | Tyan et al. | 313/506 |
| 2003/0127973 A1 | * | 7/2003 | Weaver et al. | 313/504 |
| 2003/0164496 A1 | * | 9/2003 | Do et al. | 257/40 |
| 2004/0121146 A1 | * | 6/2004 | He et al. | 428/332 |
| 2004/0247889 A1 | * | 12/2004 | Nakajima et al. | 428/423.1 |
| 2004/0253427 A1 | * | 12/2004 | Yokogawa et al. | 428/212 |
| 2005/0206311 A1 | * | 9/2005 | Bechtel et al. | 313/506 |

FOREIGN PATENT DOCUMENTS

| | | |
|---|---|---|
| EP | 1406474 A1 | 4/2004 |
| JP | 618896 | 1/1986 |
| JP | 06203957 A | 7/1994 |
| JP | 2003216061 A1 | 7/2003 |
| JP | 2004111354 A1 | 4/2004 |
| JP | 2004513484 A | 4/2004 |
| WO | 0237568 A1 | 5/2002 |
| WO | 0237580 A1 | 5/2002 |

* cited by examiner

*Primary Examiner* — Nimeshkumar D Patel
*Assistant Examiner* — Donald L Raleigh

(57) ABSTRACT

An LED includes a substrate, a first electrode layer and a thin colloidal layer located between the substrate and the first electrode layer. A smoothening layer or particles located within or on the colloidal layer is provided so that the roughness of the outer surface of the colloidal layer which is facing towards the first electrode layer is $R_a \leq 30$ nm and $R_a \geq 1$ nm.

20 Claims, 3 Drawing Sheets

LED WITH IMPROVED LIGHT EMISSION PROFILE

The invention relates to LEDs (light-emitting diodes), particularly Organic LEDs (OLEDs). Current LEDs generally comprise a substrate, a first electrode layer, in most applications made of an oxide such as ITO (indium tin oxide), an electroluminescent layer and a second electrode layer.

Due to different refractive indices, a certain amount of light emitted by the electroluminescent layer will be lost through total reflection. This particularly applies to the transition between the first electrode layer and the substrate, usually a glass substrate.

It has been found that this total reflection can be overcome to a great extent by introducing a thin colloidal layer between the substrate and the first electrode layer which comprises small particles, generally with an average size of about 100 nm to 200-300 µm. A colloidal layer is described in e.g. DE 102 28 937, which is herein incorporated by reference.

However, it has also been found that the use of such a colloidal layer greatly increases the risk of malfunctioning of such a LED.

It is therefore an object of the invention to provide a LED having the advantages of a thin colloidal layer but with a limited risk of malfunctioning or even destruction of the LED This object is achieved by a LED as defined in claim 1. Accordingly, a LED is provided, which comprises a substrate, a first electrode layer and a thin colloidal layer located between the substrate and the first electrode layer, the LED further comprising at least one smoothing means located within the colloidal layer and/or between the colloidal layer and the first electrode layer so that the outer surface of the colloidal layer facing the first electrode layer has a roughness $R_a \leq 30$ nm and $R_a \geq 1$ nm, preferably $R_a \leq 10$ nm and $R_a \geq 23$ nm and more preferably $R_a \leq 5$ nm and $R_a \geq 3$ In this context, $R_a$ is understood to be the arithmetic mean value of a surface profile, which can be measured with e.g. an atomic force microscope (AFM).

The inventors carefully studied the problem of the increased malfunctioning of LEDs having a colloidal layer and found that the smoothness of the colloidal layer on the side facing the first electrode layer is an important aspect. Since, in most applications, the first electrode layer is very thin, usually a thickness within the range of only a few 100 nm. The colloidal layer needs to be very smooth in order to ensure an overall consistent plain surface for the first electrode layer. Insufficient smoothness of the colloidal layer will lead to an increased malfunctioning of the LED. It has been found that roughnesses of $R_a \leq 30$ nm and $R_a \geq 1$ nm are required to achieve an acceptable level.

The smoothing means may be located either within the colloidal layer and/or between the colloidal layer and the first electrode layer, depending on the application and the nature of the smoothing means.

In a preferred embodiment of the invention, the smoothing means has a refractive index of $\geq 1.1$ and $\leq 3.0$, preferably $\geq 1.5$ and $\leq 2.7$ and more preferably $\geq 1.6$ and $\leq 2.7$. Losses caused by the smoothing means can then be minimized. The refractive index difference between the smoothing means and the particles in the colloidal layer is preferably $\geq |0.3|$ and $\leq |3|$, more preferably $\geq |0.5|$ and $\leq |2.5|$.

In a preferred embodiment of the invention, the smoothing means comprise at least one smoothing layer, which is essentially located between the substrate and the first electrode layer and/or within or on the colloidal layer. The ratio between the thickness of the smoothing layer and the thickness of the colloidal layer is preferably $\geq 0.9:1$ and $\leq 5:1$, more preferably $\geq 1.2:1$ and $\leq 3:1$ and most preferably $\geq 1.5:1$ and $\leq 2:1$.

In this context, "thickness of the colloidal layer" is understood to mean in particular that the thickness is measured at the point of the colloidal layer where it has its maximum expansion and/or "stretch-out". "Thickness of the smoothing layer" is understood to mean in particular that the thickness is measured at the point of the smoothing layer where it has its maximum expansion and/or "stretch-out".

The smoothing layer preferably has a thickness of $\geq 10$ nm and $\leq 10$ µm, more preferably $\geq 100$ nm and $\leq 5$ µm and most preferably $\geq 1$ µm and $\leq 3$ µm. This has proved to be the preferred thickness to obtain a smooth surface.

In a preferred embodiment of the invention, the smoothing layer is provided on the colloidal layer by means of chemical vapor deposition (CVD).

In a preferred embodiment of the invention, the smoothing layer comprises a material chosen from the group comprising $TiO_2$, $TiC$, $TiN$, $Ti(C,N)$, $SiO_2$, $B_2O_3$, $Al_2O_3$, $GeO_2$, $Rb_2O$, $Ga_2O_3$, $HfO_2$, $Ta_2O_5$, $ZrO_2$, $SiN_x$ or mixtures thereof. These materials have proved to be most efficient in practice. Other materials and mixtures may also be used if they can be applied as a smoothing layer which is sufficiently transparent.

In a preferred embodiment of the invention, the smoothing layer is provided on the colloidal layer by means of CVD of metal halides or other suitable materials.

If the above-mentioned materials are used within the smoothing layer, it is preferred to use one or more of the following volatile precursor compounds or mixtures thereof for the CVD process:

Si: trialkyl orthosilicates, particularly triethyl orthosilicate, silicon acetyl acetonate, di-t-butoxy-di-acetoxysilane, tetramethyl cyclotetrasiloxane, silanes, particularly disilane, trisilane (especially preferred if $SiN_x$ is used), silicon oxynitrides B: trialkyl boranes, particularly trimethyl borane Al: trialkoxy aluminum, particularly $Al(OC_2H_5)_3$ Ge: germanium halides, particularly $GeCl_4$ Rb: rubidium halides, particularly $RbCl$ Ga: gallium halides, particularly $GaCl_3$ Hf: hafnium halides, particularly $HfF_4$ Ta: tantalum halides, particularly $TaF_5$ and/or $TaCl_5$ Zr: zirconium halides, particularly $ZrCl_4$.

Ti: titanium halides: particularly $TiCl_2$, $TiCl_3$, $TiCl_4$

N: ammonia, hydrazine, $N_2O$

C: hydrocarbons, organic halogen compounds, particularly $CCl_4$, $CHCl_3$, $CH_2Cl_2$ During CVD, these precursor compounds react with a reactant, in the case of oxide deposition preferably with oxygen, generally on a heated substrate. The deposition temperatures preferably range between 400° C. and 600° C. for thermal CVD, which temperatures are particularly applicable for high-temperature resistive substrates. These temperatures may be lowered or adjusted by using e.g. plasma-activated or photo-assisted CVD to the range suitable for substrates for organic LEDs (T<300° C. or <400° C., depending on the application).

In a preferred embodiment of the invention, the smoothing means comprises smoothing particles, which are located within the colloidal layer and/or between the colloidal layer and the first electrode layer, the smoothing particles being preferably produced by means of sol-gel methods, preferably starting with reactive metal organic compounds.

By using such smoothing particles, an effective smoothing of the colloidal layer can be easily achieved. The ratio between the thickness of the smoothing particle batch and the thickness of the colloidal layer is preferably ≧0.9:1 and ≦5:1, more preferably ≧1.2:1 and ≦3:1 and most preferably ≧1.5:1 and ≦2:1.

In this context, "thickness of the colloidal layer" is understood to mean in particular that the thickness is measured at the point of the colloidal layer where it has its maximum expansion and/or "stretch-out". "Thickness of the smoothing particle batch" is understood to mean in particular that the thickness is measured at the point where the smoothing particle batch, obtained by stacking or filling the smoothing particles, has its maximum expansion and/or "stretch-out" (in this regard, see also FIG. 2 described below).

The smoothing particle batch preferably has a thickness of ≧10 nm and ≦10 μm, more preferably ≧100 nm and ≦5 μm and most preferably ≧200 nm and ≦3 μm. This has proved to be the preferred thickness to obtain a smooth surface.

In a preferred embodiment of the invention, the smoothing particles have an average particle size of ≧0 nm and ≦100 nm, preferably ≧5 nm and ≦50 nm and more preferably ≧10 nm and ≦30 nm.

In a preferred embodiment of the invention, the smoothing particles are obtained from a stable solution of colloidal particles produced by means of homogeneous precipitation.

Products that may be used for this process are commercially available from e.g. Nyacol, Nanogate or Nissan Chemical.

| Type | Particle size [nm] | Origin | Material |
|---|---|---|---|
| 50/20 | 50 | Nyacol | $ZrO_2$ |
| 10/20 | 10 | Nyacol | $ZrO_2$ |
| 5730(A) | 15 | Nyacol | ATO |
| Nano-ITO | 30 | Nanogate | ITO |
| AMT130S | 15 | Nissan Chemical | $Sb_2O_5$ |

In a preferred embodiment of the invention, the smoothing particles are produced from stable sols, preferably suitable metal alkoxides. During drying, the metal alkoxide sols form homogeneous gels by cross-linking reactions, forming particles in the nanometer range.

In a preferred embodiment of the invention, the ratio between the average particle size of the smoothing particles and the average particle size of the particles in the colloidal layer is ≧1:30 and ≦1:2, preferably ≧1:20 nm and ≦1:10.

In a preferred embodiment of the invention, the smoothing particles have a refractive index which is different from the refractive index of the particles in the colloidal layer. The refractive index difference between the smoothing particles and the particles in the colloidal layer is preferably ≧|0.3| and ≦|3|, more preferably ≧|0.5| and ≦|2.5|

In a preferred embodiment of the invention, the smoothing particles have a refractive index, which is equal to or higher than the refractive index of the luminescent layer. The refractive index difference between the smoothing particles and the luminescent layer is preferably ≧|0.3| and ≦|3|, more preferably ≧|0.5| and ≦|2.5|

In a further preferred embodiment of the invention, the smoothing particles comprise a metal oxide material. This metal oxide material has been either a single metal oxide or a mixed metal oxide. Metal oxides have proved to be most suitable in practice, particularly when using sol-gel methods.

In a further preferred embodiment of the invention, the smoothing particles comprise a metal oxide material chosen from the group comprising $TiO_2$, $ZrO_2$, ZnO, SbSnO, InSnO, $Sb_2O_5$, $Al_2O_3$ or mixtures thereof. These materials have proved to be the best suited in the present invention.

In a further preferred embodiment of the invention, the smoothing particles comprise an organic material. In this case, it is preferred that the organic material is a polymer organic material. Furthermore, it is preferred that the organic material is thermally stable in a temperature range of ≧150° C. and ≦300° C., preferably ≧200° C. and ≦280° C. for ≧1 min. and ≦100 min., preferably ≧30 min. and ≦60 min.

It was surprisingly found that the use of a smoothing means, particularly in combination with the particle layer according to the invention, significantly improved the emission spectrum of the LED due to a reduced half-width of the emission band and an increased steepness of the emission band in the long wavelength range of the spectrum. Depending on the application, the half-width of the emission band can be reduced by 10 to 30 nm.

A LED according to the invention can be used in a variety of systems for use in, for example: household applications, shop lighting, home lighting, accent lighting, spot lighting, theater lighting, fiber-optics applications, projection lighting, self-lit displays, pixel displays, segmented displays, warning signs, medical lighting applications, indicator signs, and decorative lighting.

The components mentioned hereinbefore, as well as the components claimed and the components to be used in accordance with the described embodiments of the invention are not subject to any special exceptions as regards their size, shape, material, selection and technical concept, so that the selection criteria known in the pertinent field can be applied without limitations.

Additional details, characteristics and advantages of the object of the invention are disclosed in the dependent claims and the following description of the respective Figures, showing examples of several preferred embodiments of the LED according to the invention.

Figure 1:
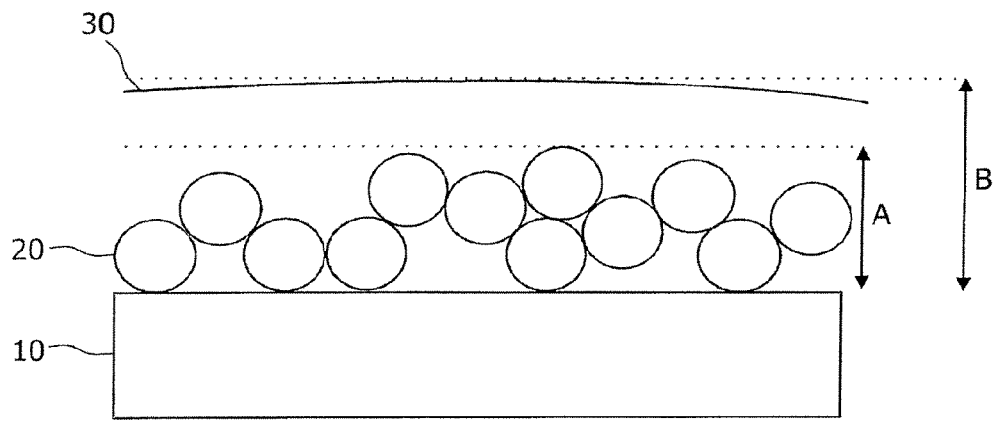
FIG. 1 is a very schematic partial cross-sectional view of a LED in accordance with a first embodiment of the invention.
Figure 2:
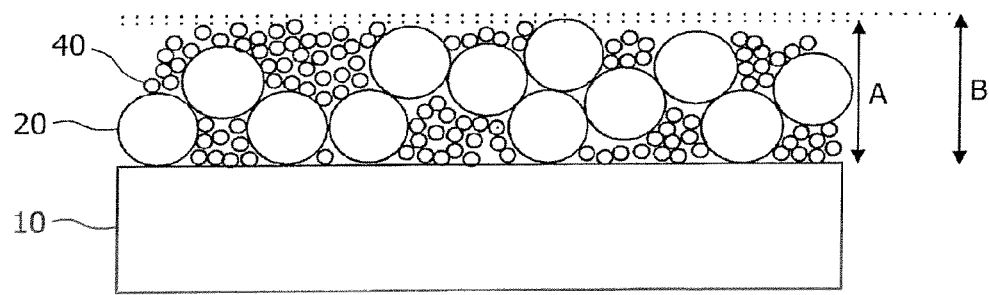
FIG. 2 is a very schematic partial cross-sectional view of a LED in accordance with a second embodiment of the invention.

FIGS. 1 and 2 are very schematic partial cross-sectional views of a LED in accordance with a first and a second embodiment of the invention. In both embodiments, the LED comprises a substrate 10, which is generally a glass substrate, and a colloidal layer which is built up of small particles 20, the diameter of which generally ranges between 100 and 300 nm.

FIG. 1 shows a first embodiment, in which a smoothing layer has been provided on the particles 20 which constitute the colloidal layer. The smoothing layer is preferably provided on the colloidal layer in such a way that all of the particles are covered by the smoothing layer, which then has an upper surface as denoted by the reference numeral 30. A very even upper surface of the colloidal layer can be obtained in this way. A first electrode layer (e.g. an ITO-layer) can then be provided on the smoothing layer (not shown in the Figs.). Arrow A shows the thickness of the colloidal layer (also indicated by a dotted line), and arrow B shows the thickness of the smoothing layer (also indicated by a second dotted line). The smoothing layer has a thickness, which is 1.5 times larger than the thickness of the colloidal layer. It is preferred that the ratio between the thickness of the smoothing layer and the thickness of the colloidal layer is $\geq 0.9:1$ and $\leq 5:1$, more preferably $\geq 1.2:1$ and $\leq 3:1$ and most preferably $\geq 1.5:1$ and $\leq 2:1$.

FIG. 2 shows a second embodiment of the invention, in which smoothing particles 40 have been provided within and on the colloidal layer. As can be seen from FIG. 2, this also results in a smoothing of the top surface of the colloidal layer. Arrow A shows the thickness of the colloidal layer (also indicated by a dotted line), and arrow B shows the thickness of the smoothing particle batch (also indicated by a second dotted line). The smoothing particle batch has a thickness which is 1.05 times larger than the thickness of the colloidal layer. It is preferred that the ratio between the thickness of the smoothing layer and the thickness of the colloidal layer is $\geq 0.9:1$ and $\leq 5:1$.

Figure 4A:
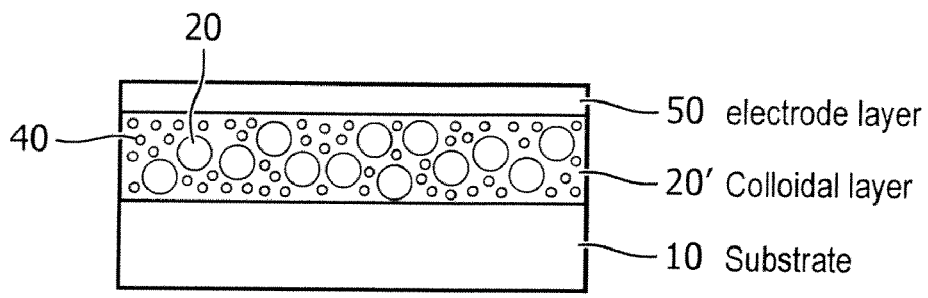
FIGS. 4A-4C are partial cross-sectional views of LEDs in accordance with various embodiments of the invention.
Figure 4B:
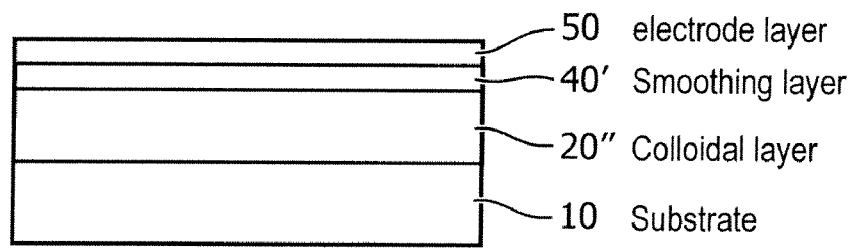
Figure 4C:
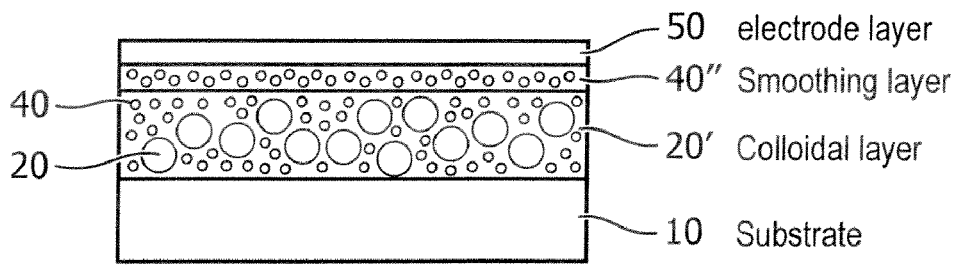

FIGS. 4A-4C are partial cross-sectional views of LEDs in accordance with various embodiments of the invention. In particular, FIG. 4A shows an embodiment where the colloidal layer 20' is between the substrate 10 and an electrode layer 50, and the smoothing means includes particles 40 within the colloidal layer 20'. FIG. 4B shows another embodiment where the smoothing layer 40' is located on the colloidal layer 20", such as between the colloidal layer 20" and the electrode layer 50. FIG. 4C shows yet another embodiment where the smoothing means includes particles 40 within the colloidal layer 20', as well as a smoothing layer 40" on the colloidal layer 20', such as between the colloidal layer 20' and an electrode layer 50.

Figure 3:
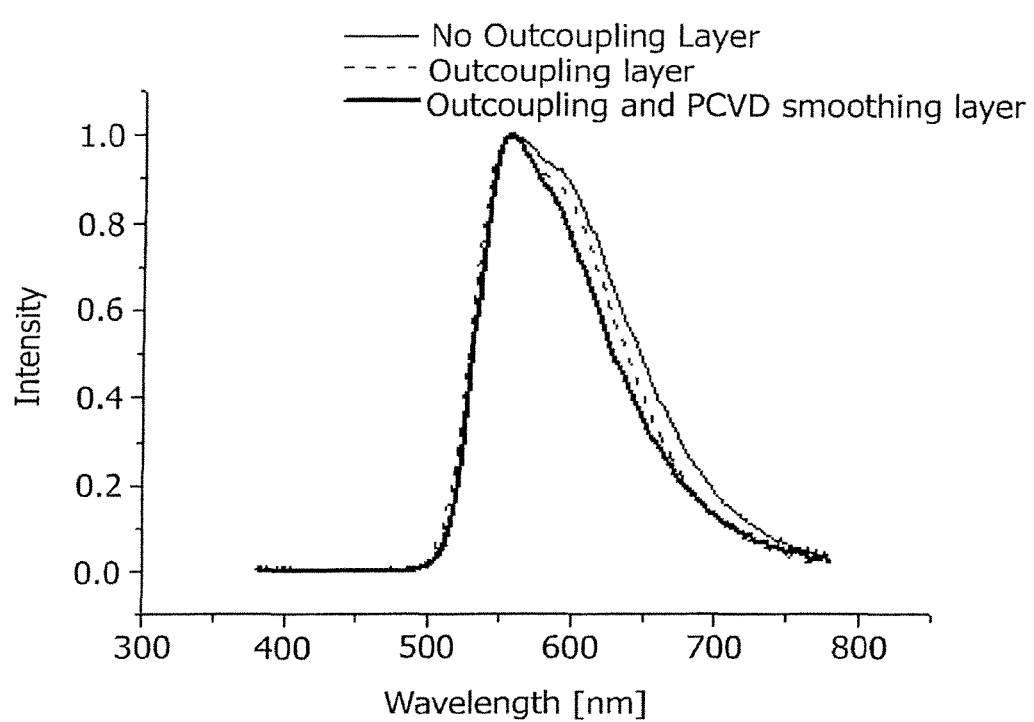
FIG. 3 is a light emission spectrum of a LED in accordance with a first example of the invention in comparison with a LED without a smoothing means according to the invention.

FIG. 3 shows a light emission spectrum of a LED in accordance with a first example.

The LED was prepared in the following way.

A 0.7 mm glass substrate washed and impregnated in a bath of $H_2SO_4$ (99%)/$H_2O_2$ (30%) (100:5) for 30 min.

The layer thus treated was subsequently washed with water and impregnated for 2 minutes with a 4 g/l polydiallyl methyl aluminum chloride solution (as obtained from Aldrich). The layer was then washed once again with water and coated for 40 seconds in a 10% $SiO_2$-solution containing particles with a size of 200 nm. This process (washing/PAH/washing/$SiO_2$) was repeated once.

A smoothing means was subsequently provided on the glass substrate by spin coating of $ZrO_2$-particles (10 nm): Nyacol (AC) LOT No. 15-001657 1:20 suspension.

After drying a Ra value of 15 nm was achieved. Then a 140 nm ITO layer was provided by means of sputtering. Then the LED was finished similarly as in known state-of-the-art methods, using PDOT-PSS (Baytron® P VP AI 4083 from H.C. Starck) as hole transporting layer and PPV (poly(2-methoxy-5-(2'-ethyl-hexyloxy)-p-phenylene vinylene)) as emissive layer.

As can be seen from FIG. 3, the emission spectrum of the LED with a colloidal layer (referred to as outcoupling layer in FIG. 3) is narrowed as compared to a LED without an outcoupling layer (=colloidal layer). By further using a smoothing means (referred to as smoothing layer in FIG. 3) according to the invention, the emission spectrum is further narrowed by approx. 15 nm.

Measuring Methods

The Ra-values were measured with an atomic force microscope (AFM), operated in the non-contact mode. A high resolution could thus be achieved without damaging the sample.

$R_a$-values were calculated from a two-dimensional measurement of the surface profile by $$R_a = \frac{1}{L_x L_y} \int_0^{L_x} \int_0^{L_y} |f(x,y)| dx dy$$

wherein $f(x,y)$ is the deviation of the height profile L (L=f (A,B)) from the average height, and $R_a$ is the arithmetic mean of the deviation over a scanned area x,y. The scanned area typically has a size of $10\times10$ $\mu m^2$.

The invention claimed is:

1. A light emitting diode (LED) comprising:
   a substrate;
   an electrode layer;
   a colloidal layer located between the substrate and the electrode layer, the colloidal layer including colloidal particles; and
   smoothing means including smoothing particles located between the colloidal particles and in contact with the substrate and between the colloidal layer and the electrode layer so that an outer surface of the colloidal layer facing the electrode layer has a roughness $R_a \leq 30$ nm and $R_a \geq 1$ nm, wherein the smoothing particles are smaller than the colloidal particles.

2. The LED as claimed in claim 1, wherein the smoothing means has a refractive index of $\geq 1.1$ and $\leq 3.0$.

3. The LED as claimed in claim 1, wherein the smoothing means comprise at least one smoothing layer which is located on the colloidal layer, and wherein a ratio between the thickness of the smoothing layer and the thickness of the colloidal layer is $\geq 0.9:1$ and $\leq 5:1$.

4. The LED as claimed in claim 1, wherein the smoothing layer is provided on the colloidal layer by means of chemical vapor deposition (CVD).

5. The LED as claimed in claim 1, wherein the smoothing layer comprises a material chosen from the group comprising $TiO_2$, TiC, TiN, Ti(C,N), $SiO_2$, $B_2O_3$, $Al_2O_3$, $GeO_2$, $Rb_2O$, $Ga_2O_3$, $HfO_2$, $Ta_2O_5$, $ZrO_2$, $SiN_x$ or mixtures thereof.

6. The LED as claimed in claim 1, wherein the smoothing means comprises smoothing particles which are located at least one of within the colloidal layer and between the colloidal layer and the electrode layer, the smoothing particles being preferably produced by means of sol-gel methods, preferably starting with reactive metal organic compounds.

7. The LED as claimed in claim 1, wherein the smoothing particles have an average particle size of $\geq 5$ nm and $\leq 50$ nm.

8. The LED as claimed in claim 1, wherein the smoothing means comprise smoothing particles which have a refractive index which is different from a refractive index of particles in the colloidal layer, preferably a difference of $\geq |0.3|$ and $\leq |3|$.

9. The LED as claimed in claim 1, wherein the smoothing means comprise smoothing particles which comprise a metal oxide material chosen from the group comprising $TiO_2$, TiC, TiN, $ZrO_2$, ZnO, SbSnO, InSnO, $Sb_2O_5$, $Al_2O_3$ or mixtures thereof, and/or an organic material.

10. A system comprising a LED as claimed in claim 1, for use in:
    household applications,
    shop lighting,
    home lighting,
    accent lighting,
    spot lighting,
    theater lighting, fiber-optics applications,
projection lighting,
self-lit displays,
pixel displays,
segmented displays,
warning signs,
medical lighting applications,
indicator signs, and
decorative lighting.

11. The LED of claim 1, wherein the smoothing particles have an average particle size of 10 nm, and the colloidal particles having an average particle size of 200 nm.

12. The LED of claim 1, wherein an average particle size of the colloidal particles is 20 times larger than an average particle size of the smoothing particles of the smoothing means.

13. The LED of claim 1, wherein the smoothing means has a refractive index which is equal to or higher than a refractive index of a luminescent layer of the LED.

14. The LED of claim 13, wherein the refractive index of the smoothing particles is different from the refractive index of the luminescent layer by a difference of $\geq |0.5|$ and $\leq |2.5|$.

15. The LED of claim 1, wherein the smoothing means reduce a half-width of an emission band of the LED.

16. The LED of claim 1, wherein the smoothing means reduce a half-width of an emission band of the LED by 10 nm to 30 nm.

17. A light emitting diode (LED) comprising:
a substrate;
an electrode layer;
a colloidal layer located between the substrate and the electrode layer, the colloidal layer including colloidal particles; and
smoothing particles located within the colloidal layer and between the colloidal particles and in contact with the substrate so that an outer surface of the colloidal layer facing the electrode layer has a roughness $R_a \leq 30$ nm and
$R_a \geq 1$ nm, wherein the smoothing particles are smaller than the colloidal particles.

18. The LED of claim 17, wherein the smoothing particles form a smoothing layer which is located on the colloidal layer, and wherein a ratio between a thickness of the smoothing layer and a thickness of the colloidal layer is $\geq 0.9:1$ and $\leq 5:1$, and a ratio between an average particle size of the smoothening particles and an average particle size of the colloidal particles is $\geq 1:20$ and $\leq 1:10$.

19. The LED of claim 17, wherein an average particle size of the colloidal particles is 20 times larger than an average particle size of the smoothing particles.

20. The LED of claim 17, wherein a ratio between an average particle size of the smoothening particles and an average particle size of the colloidal particles is $\geq 1:30$ and $\leq 1:2$.

* * * * *